United States Patent

Wang et al.

[11] Patent Number: 6,048,796
[45] Date of Patent: Apr. 11, 2000

[54] METHOD OF MANUFACTURING MULTILEVEL METAL INTERCONNECT

[75] Inventors: Kun-Chih Wang, Taipei Hsien; Wen-Yi Hsieh, Hsinchu; Yimin Huang, Taichung Hsien; Chih-Chien Liu, Taipei; Water Lur, Taipei, all of Taiwan

[73] Assignee: United Microelectronics Corp., Taiwan

[21] Appl. No.: 09/211,891

[22] Filed: Dec. 15, 1998

[51] Int. Cl.[7] ..................................................... H01L 21/00

[52] U.S. Cl. ............................................ 438/692; 438/745

[58] Field of Search .................................... 438/631, 637, 438/645, 672, 675, 691, 692, 693, 723, 724, 743, 744, 745; 216/18, 38, 79

[56] References Cited

U.S. PATENT DOCUMENTS 5,960,317   9/1999   Jeong et al. ......................... 438/692 X
6,001,730  12/1999   Farkas et al. ....................... 438/692 X Primary Examiner—William Powell
Attorney, Agent, or Firm—Blakely Sokoloff Taylor & Zafman

[57] ABSTRACT

A method is described for manufacturing a multilevel metal interconnects. The method comprises the steps of providing a substrate and then forming a wire on the substrate. A dielectric layer is formed on the substrate and the wire and a protective layer is formed on the dielectric layer. An opening is formed by patterning the protective layer and the dielectric layer and a barrier layer is formed on the protective layer and in the opening. A copper layer is formed on the barrier layer and fills the opening. A portion of the copper layer and the barrier layer are removed by chemical-mechanical polishing.

17 Claims, 3 Drawing Sheets

METHOD OF MANUFACTURING MULTILEVEL METAL INTERCONNECT

BACKGROUND OF THE INVENTION

1. Field of the Invention

The present invention relates to a method of manufacturing a semiconductor device. More particularly, the invention relates to a metal damascene method for manufacturing a multilevel metal interconnect.

2. Description of the Related Art

Due to the increasingly high integration of ICs, chips simply cannot provide sufficient area for manufacturing interconnections. Therefore, in accord with the increased interconnects manufacturing requirements of miniaturized MOS transistors, it is increasingly necessary for IC manufacturing to adopt a design with more than two metal layers. In particular, a number of multi-function products, such as microprocessors, even require 4 or 5 metal layers to complete the internal connections thereof. Generally, an inter-metal dielectric (IMD) layer is used to electrically isolate two adjacent metal layers from each other. Moreover, a conductive layer used to electrically connect the two adjacent metal layers is called a via plug in the semiconductor industry.

Generally, the via plug is made of tungsten or aluminum, and the wire is made of aluminum. When the wire width becomes smaller, the tungsten or aluminum via plug and aluminum wire become less appropriate, because the resistance of tungsten and aluminum seriously affect the RC time constant of the connections between the devices.

Since copper has many good qualities such as a high melting point, high electromigration resistance and low resistance, it can prove advantageous to use copper as the interconnects. Additionally, the copper wire is twice as efficient as aluminum wire. The RC delay and the static capacitance which exists between the wires can be reduced by using copper interconnects. In order to increase the integration of ICs and the transportation rate of devices, it is necessary to use copper as a multilevel metal interconnects.

FIGS. 1A through 1C are schematic, cross-sectional views of the conventional damascene process for manufacturing a multilevel metal interconnects.

As shown in FIG. 1A, a substrate 100 is provided. A wire 102 is formed on the substrate 100. A dielectric layer 104 is formed on the substrate 100 and the wire 102. A via hole 110 is formed by patterning the dielectric layer 104 to expose a portion of the wire 102.

As shown in FIG. 1B, a barrier layer 106 is formed on the dielectric layer 104 and in the via hole 110. The barrier layer 106 is used as an intermediate layer to prevent the interaction of conductive material with dielectric material. A copper layer 108 is formed on the barrier layer 106 and fills the via hole 110. The copper layer 108 can be made from copper or copper alloy.

As shown in FIG. 1C, a chemical-mechanical polishing step (CMP) is used to strip a portion of the conductive layer 108 and the barrier layer 106, and then a via plug 114 is formed in the dielectric layer 104.

Consequently, after performing a CMP step to the conductive layer 108 and the barrier layer 104, copper particles 108a are remained on the surface of the dielectric layer 104. It is often that copper particles 108a penetrate into, or even through the dielectric layer 104 to induce leakage and device failure. Furthermore, as shown in FIG. 2, a photoresist 206 is used to form a via hole. Since a portion of the photoresist 206 is worn away while performing an etching step, it leads to a sloped via hole and distortion of the pattern. The distortion of the pattern is a barrier to miniaturizing devices. Moreover, the polishing rates are different between dense and light regions of the wire and the via plug, so that while performing a chemical-mechanical polishing step to strip a portion of the conductive layer 108 and the barrier layer 106, the dense region of the wire or the via plug manifests dishing, which is an oxide recess. Thus, the uniformity is poor.

SUMMARY OF THE INVENTION

It is therefore an objective of the invention to provide a method of manufacturing multilevel metal interconnects that overcome the problem of the leakage and the device failure caused by the copper particles left on the dielectric layer after a chemical-mechanical polishing step.

It is another an objective of the invention to provide a method of manufacturing multilevel metal interconnects to overcome the problem of the pattern distortion.

It is yet another objective of the invention which provides a method of manufacturing multilevel metal interconnects to overcome the problem of oxide recesses that occur while performing a chemical-mechanical polishing step.

To achieve these and other advantages and in accordance with the purpose of the invention, as embodied and broadly described wherein, the invention provides a method of manufacturing multilevel metal interconnects. The method comprises the steps of providing a substrate. A wire is formed on the substrate. A dielectric layer is formed on the substrate and the wire and a protective layer is formed on the dielectric layer. An opening is formed by patterning the protective layer and the dielectric layer and a barrier layer is formed on the protective layer and in the opening. A copper layer is formed on the barrier layer and fills the opening. A portion of the copper layer and the barrier layer are removed by chemical-mechanical polishing.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
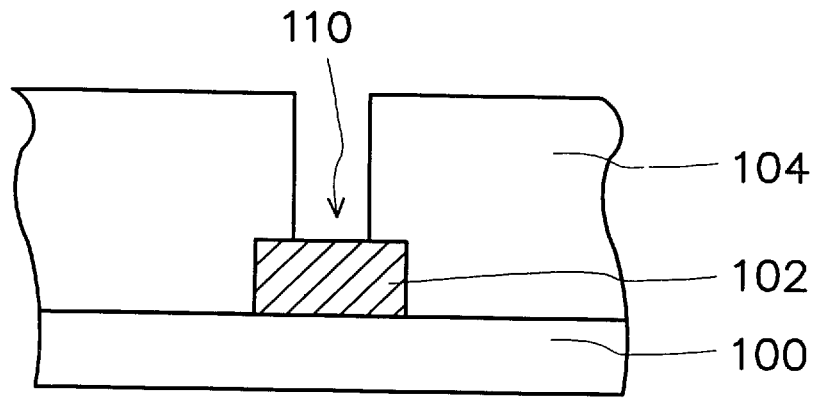
FIGS. 1A through 1C are schematic, cross-sectional views of the conventional damascene process for manufacturing a multilevel metal interconnects.
Figure 1B:
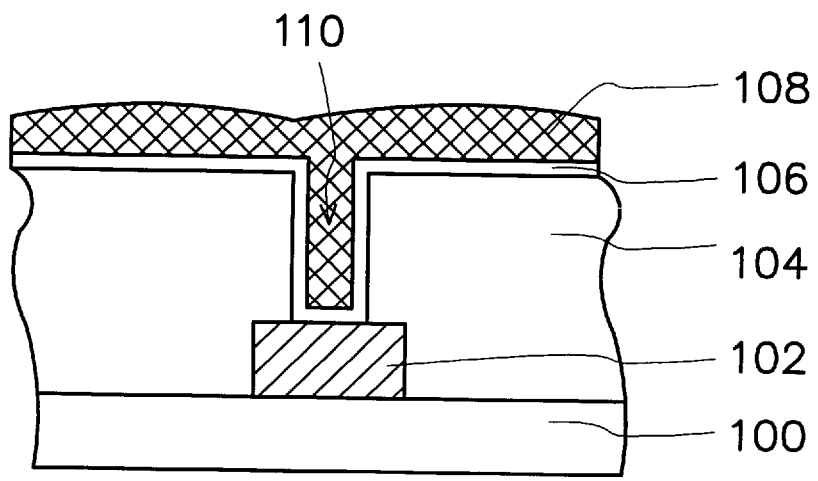
Figure 1C:
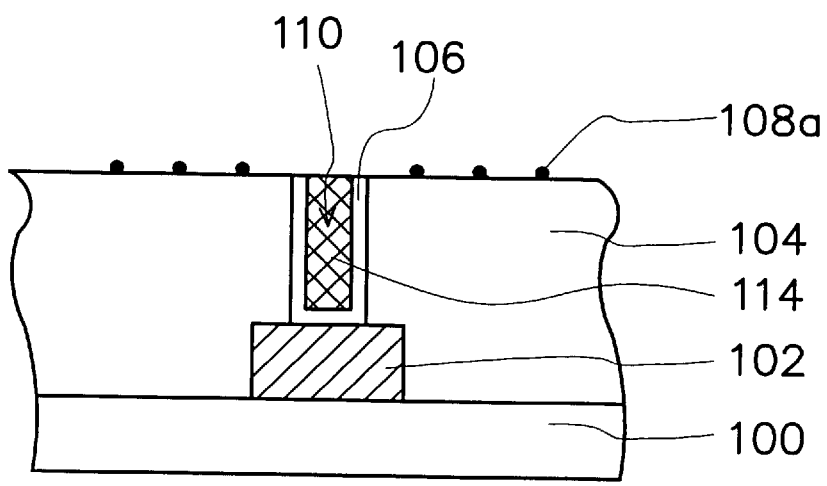
Figure 2:
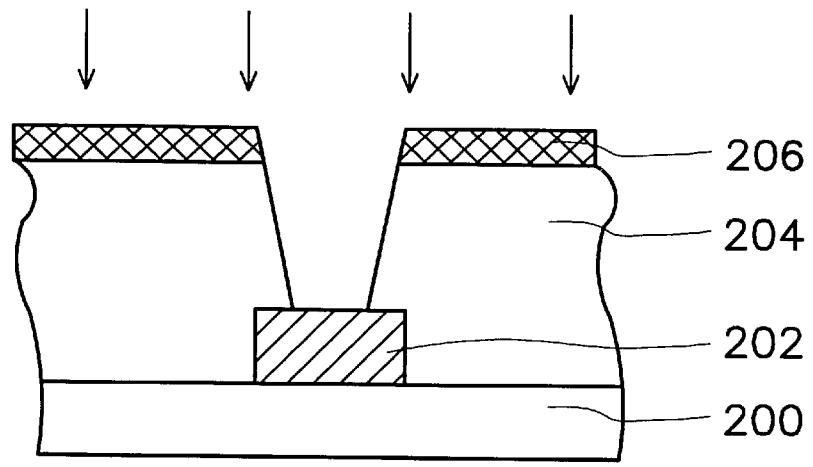
FIG. 2 is a schematic, cross-sectional view of the sloped via hole induced by performing an etching step in the conventional damascene process for manufacturing a multilevel metal interconnects.

Reference will now be made in detail to the present preferred embodiments of the invention, examples of which are illustrated in the accompanying drawings. Wherever possible, the same reference numbers art used in the drawings and the description to refer to the same or like parts.

FIGS. 3A through 3E are schematic, cross-sectional views of the damascene process for manufacturing a multilevel metal interconnect in a preferred embodiment according to the invention.

Figure 3A:
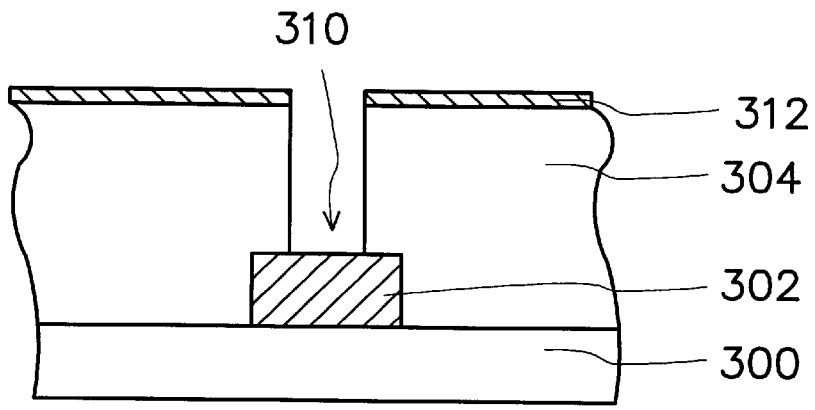
FIGS. 3A through 3E are schematic, cross-sectional views of the damascene process for manufacturing a multilevel metal interconnects in a preferred embodiment according to the invention.

As shown in FIG. 3A, a substrate 300 is provided. A wire 302 is formed on the substrate 300. A dielectric layer 304, such as a silicon oxide layer, is formed on the substrate 300 and the wire 302. The method of forming the dielectric layer 304 can be plasma enhanced chemical vapor deposition with conditions of a temperature of about 300–400 degrees centigrade and a pressure of about 0.1–5 torr, for example. A protective layer 312, such as a silicon nitride layer, is formed on the dielectric layer 304. The method of forming the protective layer 312 can be plasma-enhanced chemical vapor deposition with conditions of a temperature of about 250–400 centigrade and a pressure of about 1–5 torr, for example. The protective layer 312 is a very important feature of the invention. After a subsequent CMP step which is to be described in the following paragraph, the protective layer 312 is polished. However, it is very likely that the conductive particles 308a (as shown in FIG. 3D) are left over the substrate 200 after the conductive layer 308 is removed by CMP. Without formation of the protective layer 312, those conductive particles 308a can easily penetrate into or even through the dielectric layer 312 to cause leakage and device failure. In the invention, the protective layer 312 is sufficiently dense to prevent the dielectric layer 304 from penetration by the conductive particles 308a. Additionally, the protective layer 312 is hard enough to be used as a hard mask during a subsequent etching step. Therefore, the distortion of the pattern caused by a patterning step and the oxide recess induced by performing a chemical-mechanical polishing step do not occur. A via hole 310 is formed by patterning the protective layer 312 to expose a portion of the wire 302.

Figure 3B:
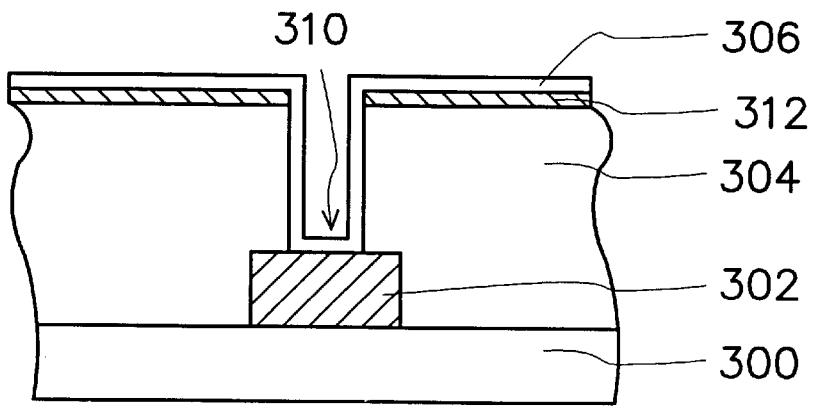

As shown in FIG. 3B, a barrier layer 306 is formed on the protective layer 312 and in the via hole 310. The barrier layer 306 can be made of tantalum nitride or other barrier material, for example. The barrier layer 306 is used as an intermediate layer to prevent the interaction between conductive material and dielectric material.

Figure 3C:
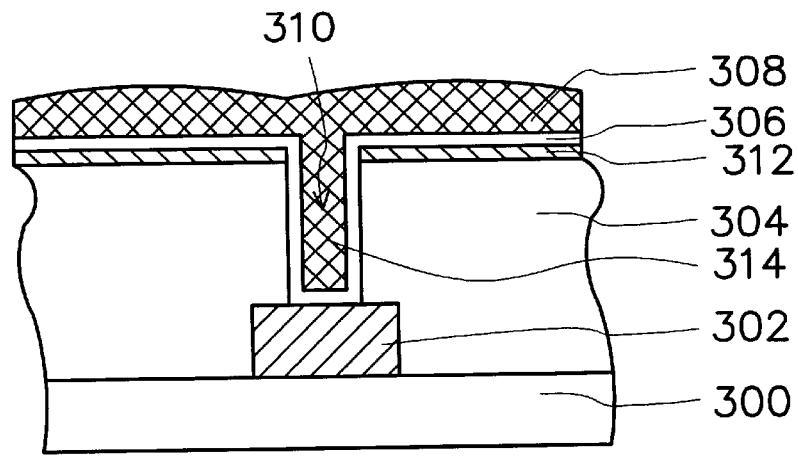
Figure 3D:
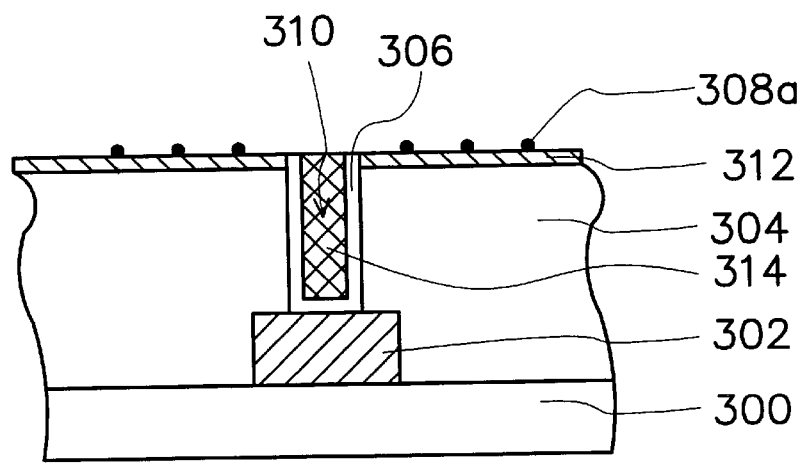

As shown in FIG. 3C, a conductive layer 308 is formed on the barrier layer 306 and fills the via hole 310. The conductive layer 308 can be made of copper or copper alloy.

As shown in FIG. 3D, a chemical-mechanical polishing step is used to strip away a portion of the conductive layer 308 and the barrier layer 306, and then a via plug 314 is formed in the dielectric layer 304 and several conductive particles 308a are left on the protective layer 312.

Figure 3E:
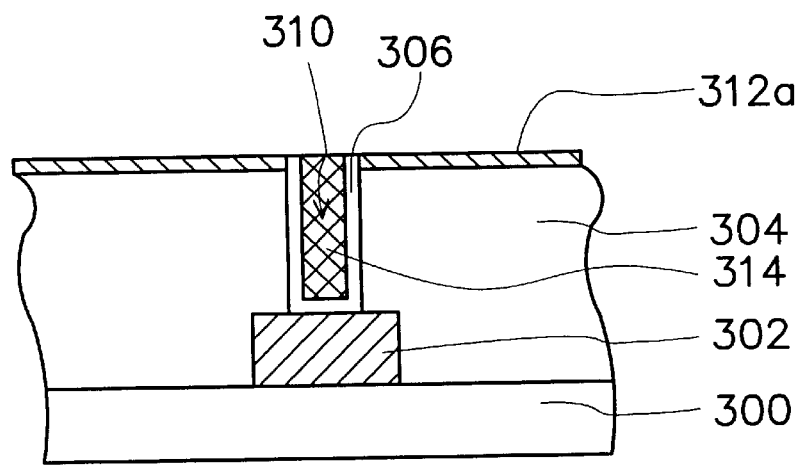

As shown in FIG. 3E, the conductive particles 308a and a portion of the protective layer 312 are removed by performing an over-polishing step, so that a portion of the protective layer 312 is removed and resulted as the protective layer 312a. Since the protective layer 312a is dense enough, so that the conductive particles 308a cannot penetrate through the protective layer 312a and into the dielectric layer 304.

In the preferred embodiment according to the invention, before the via hole 310 is formed, the protective layer 312 is formed on the dielectric layer 304. Because the protective layer 312 is dense and hard enough, so that the protective layer 312 can protect the dielectric layer 304 from being penetrated by the conductive particles 308a subsequently formed by chemical-mechanical polishing. Moreover, the protective layer 312 can prevent the pattern from becoming distorted during performing an etching step and overcome the problem of an oxide recess induced by performing a chemical-mechanical polishing step.

The invention is denoted as the damascene process for manufacturing a via plug in the preferred embodiment of the invention. It is appreciated that people skilled in the art may also adopt the technique mentioned about to fabricate different kind of openings, such as via holes or trenches, according to the specific requirement.

Altogether, the characteristics of the invention include the following:

1. In the invention, the protective layer is formed on the dielectric layer before the via hole and the trench are formed. Because the protective layer is dense and tough, the protective layer can prevent that the dielectric layer from penetration by the conductive particles subsequently formed by chemical-mechanical polishing. Therefore, leakage and device failure can be avoided.

2. In the invention, the protective layer is tough, so that the protective layer is used as a hard mask of the dielectric layer under the protective layer to prevent the distortion of the pattern induced by performing an etching step.

3. In the invention, the protective layer is tough, thus the protective layer can overcome the problem of oxide recess induced by performing a chemical-mechanical polishing step.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method of manufacturing a multilevel metal interconnect, comprising the steps of:

providing a substrate having a wire on the substrate;

forming a dielectric layer on the substrate and the wire;

forming a protective layer on the dielectric layer;

forming an opening to expose a portion of the wire;

forming a barrier layer on the protective layer and in the opening;

forming a copper layer on the barrier layer to fill the opening; and polishing the copper layer and the barrier layer by using chemical-mechanical polishing.

2. The method of claim 1, wherein the protective layer includes a silicon nitride layer.

3. The method of claim 1, wherein the opening includes a trench.

4. The method of claim 1, wherein the method of forming the protective layer includes plasma enhanced chemical vapor deposition.

5. The method of claim 1, wherein the dielectric layer includes a silicon oxide layer.

6. The method of claim 1, wherein the method of forming the dielectric layer includes plasma enhanced chemical vapor deposition.

7. The method of claim 1, wherein the barrier layer includes a tantalum nitride layer.

8. The method of claim 1, further comprising a step of performing an over-polishing step utilized to strip away a portion of the protective layer.

9. A method of manufacturing a multilevel metal interconnect, comprising the steps of:

provided a substrate having a wire thereon;

forming a dielectric layer and a protective layer with an opening which exposes a part of the wire over the substrate; and forming a plug to fill the opening.

10. The method of claim 9, wherein material of the plug includes copper.

11. The method of claim 9, wherein material of the plug includes copper alloy.

12. The method of claim 9, wherein the protective layer includes a silicon nitride layer.

13. The method of claim 9, wherein the opening includes a trench.

14. The method of claim 9, wherein the method of forming the protective layer includes plasma enhanced chemical vapor deposition.

15. The method of claim 9, wherein the dielectric layer includes a silicon oxide layer.

16. The method of claim 9, wherein the method of forming the dielectric layer includes plasma enhanced chemical vapor deposition.

17. The method of claim 9, further comprising a step of performing an over-polishing step utilized to strip away a portion of the protective layer.

* * * * *